United States Patent
Mears et al.

(10) Patent No.: US 7,446,002 B2
(45) Date of Patent: Nov. 4, 2008

(54) METHOD FOR MAKING A SEMICONDUCTOR DEVICE COMPRISING A SUPERLATTICE DIELECTRIC INTERFACE LAYER

(75) Inventors: Robert J. Mears, Wellesley, MA (US); Marek Hytha, Brookline, MA (US); Scott A. Kreps, Southborough, MA (US); Robert John Stephenson, Newton Upper Falls, MA (US); Jean Augustin Chan Sow Fook Yiptong, Worchester, MA (US); Ilija Dukovski, Newton, MA (US); Kalipatnam Vivek Rao, Waltham, MA (US); Samed Halilov, Waltham, MA (US); Xiangyang Huang, Waltham, MA (US)

(73) Assignee: MEARS Technologies, Inc., Waltham, MA (US)

( * ) Notice: Subject to any disclaimer, the term of this patent is extended or adjusted under 35 U.S.C. 154(b) by 242 days.

(21) Appl. No.: 11/136,747

(22) Filed: May 25, 2005

(65) Prior Publication Data
US 2006/0019454 A1  Jan. 26, 2006

Related U.S. Application Data

(63) Continuation-in-part of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003, now abandoned.

(51) Int. Cl.
*H01L 21/336* (2006.01)

(52) U.S. Cl. ............... 438/285; 438/289; 438/287; 438/478; 438/602

(58) Field of Classification Search ................. None
See application file for complete search history.

(56) References Cited

U.S. PATENT DOCUMENTS 4,485,128 A    11/1984  Dalal et al. ............... 427/85

(Continued)

FOREIGN PATENT DOCUMENTS

EP            0 843 361           5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—David E Graybill
(74) *Attorney, Agent, or Firm*—Allen, Dyer, Doppelt, Milbrath & Gilchrist, P.A.

(57) ABSTRACT

A method for making a semiconductor device may include forming a superlattice comprising a plurality of stacked groups of layers adjacent a substrate. Each group of layers of the superlattice may include a plurality of stacked base semiconductor monolayers defining a base semiconductor portion, and at least one non-semiconductor monolayer constrained within a crystal lattice of adjacent base semiconductor portions. The method may further include forming a high-K dielectric layer on the electrode layer, and forming an electrode layer on the high-K dielectric layer and opposite the superlattice.

21 Claims, 9 Drawing Sheets

U.S. PATENT DOCUMENTS

| | | | | |
|---|---|---|---|---|
| 4,594,603 | A | 6/1986 | Holonyak, Jr. | 357/16 |
| 4,882,609 | A | 11/1989 | Schubert et al. | 357/22 |
| 4,908,678 | A | 3/1990 | Yamazaki | 357/4 |
| 4,937,204 | A | 6/1990 | Ishibashi et al. | 437/110 |
| 4,969,031 | A | 11/1990 | Kobayashi et al. | 357/63 |
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,357,119 | A | 10/1994 | Wang et al. | 257/18 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 | 4/2002 | Wang et al. | 438/478 |
| 6,436,784 | B1 | 8/2002 | Allam | 438/380 |
| 6,472,685 | B2 | 10/2002 | Takagi | 257/77 |
| 6,498,359 | B2 | 12/2002 | Schmidt et al. | 257/190 |
| 6,501,092 | B1 | 12/2002 | Nikonov et al. | 257/29 |
| 6,521,549 | B1 | 2/2003 | Kamath et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 6,958,486 | B2 * | 10/2005 | Mears et al. | 257/15 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0176049 | A1 * | 9/2003 | Hedge et al. | 438/591 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |
| 2004/0238904 | A1 | 12/2004 | Colombo et al. | 257/410 |
| 2006/0019454 | A1 * | 1/2006 | Mears et al. | 438/289 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |
| WO | WO2005013371 | 2/2005 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, 2004 Nanosys, Inc.

"High-[kappa] Gate Dielectrics: Current Status and Materials Properties Considerations", Wil et al., Journal of Applied Physics, American Institute of Physics, NY, US, vol. 89, No. 10, May 15, 2001, pp. 5243-5275, XP012052062, ISSN: 0021-8979.

* cited by examiner

METHOD FOR MAKING A SEMICONDUCTOR DEVICE COMPRISING A SUPERLATTICE DIELECTRIC INTERFACE LAYER

CROSS-REFERENCE TO RELATED APPLICATIONS

This application is a continuation-in-part of U.S. patent application Ser. No. 10/647,060 filed Aug. 22, 2003, now U.S. Pat. No. 6,958,486 which is a continuation-in-part of U.S. patent applications Ser. No. 10/603,696 now abandoned and Ser. No. 10/603,621 filed on Jun. 26, 2003, now abandoned the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features. Moreover, there is a need for structures which provide enhanced mobility adjacent dielectric layer interfaces, particularly in applications where high-K dielectrics are used.

SUMMARY OF THE INVENTION

In view of the foregoing background, it is therefore an object of the present invention to provide a method for making a semiconductor device including a superlattice which provides a dielectric interface for reducing scattering, for example.

This and other objects, features, and advantages in accordance with the present invention are provided by a method for making a semiconductor device which may include forming a superlattice comprising a plurality of stacked groups of layers adjacent a substrate. In particular, each group of layers of the superlattice may include a plurality of stacked base semiconductor monolayers defining a base semiconductor portion, and at least one non-semiconductor monolayer constrained within a crystal lattice of adjacent base semiconductor portions. The method may further include forming a high-K dielectric layer on the electrode layer, and forming an electrode layer on the high-K dielectric layer and opposite the superlattice.

The superlattice advantageously acts as an interface for the high-K dielectric layer which provides reduced scattering and, thus, enhanced mobility with respect to prior art insulation layers such as silicon oxides. Moreover, use of the superlattice as an insulator may result in smaller overall thicknesses, and thus improved device capacitance.

In accordance with one aspect of the invention, the high-K dielectric layer may have a dielectric constant of greater than about five and, more particularly, greater than about ten or twenty, for example. Moreover, the at least one non-semiconductor monolayer constrained within the crystal lattice of adjacent base semiconductor portions may be less than about five monolayers to thereby function as an energy band-modifying layer. By way of example, the high-K dielectric layer may include at least one of silicon oxide, zirconium oxide, and hafnium oxide.

The method may further include forming a channel region underlying the superlattice, as well as forming source and drain regions adjacent the channel region. By way of example, the base semiconductor may comprise silicon, and the at least one non-semiconductor monolayer may comprise oxygen. More specifically, the at least one non-semiconductor monolayer may comprise a non-semiconductor selected from the group consisting of oxygen, nitrogen, fluorine, and carbon-oxygen.

The at least one non-semiconductor monolayer may be a single monolayer thick, and each base semiconductor portion may be less than eight monolayers thick, for example. Furthermore, in some embodiments all of the base semiconductor portions are a same number of monolayers thick. In other embodiments, at least some of the base semiconductor portions may be a different number of monolayers thick. Moreover, opposing base semiconductor monolayers in adjacent groups of layers of the superlattice may be chemically bound together.

DETAILED DESCRIPTION OF THE PREFERRED EMBODIMENTS

Figure 1:
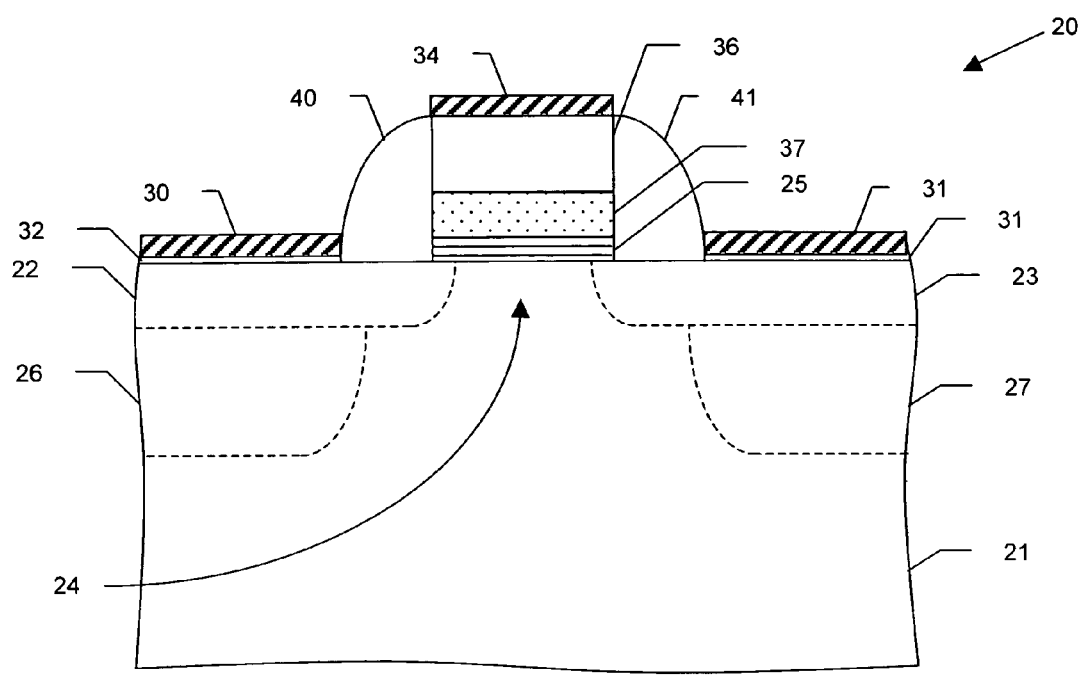
FIG. 1 is schematic cross-sectional diagram of a semiconductor device in accordance with the present invention including a superlattice.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k, n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material as a dielectric interface layer in a semiconductor device. A planar MOSFET 20 including the superlattice 25 in accordance with the invention is first described with reference to FIG. 1. One skilled in the art, however, will appreciate that the materials identified herein could be used in many different types of semiconductor devices, such as discrete devices and/or integrated circuits. By way of example, another application in which the superlattice 25 may be used as a dielectric interface layers is FINFETs.

In particular, as the trend toward ever-smaller FET devices continues, the use of high-K gate dielectric materials becomes more attractive. This is because traditional gate dielectric materials such as silicon dioxide ($SiO_2$) tend to cause leakage if they are overly thinned in an attempt to reduce device size. Yet, placing a high-K material directly in contact with the device channel may lead to other problems, such as "bleeding" of the high-K material into the channel. As a result, in most applications where high-K gate dielectrics are used, an interfacial $SiO_2$ layer is deposited between the channel region and the high-K material. However, this potentially offsets the size reduction achieved by using the thin high-K material to some extent, and may also reduce device capacitance. Moreover, undesirable scattering may occur at the $SiO_2$/high-K interface.

The illustrated MOSFET 20 includes a substrate 21, lightly doped source/drain extension regions 22, 23, more heavily doped source/drain regions 26, 27, and a channel region 24 therebetween. The superlattice 25 overlies the channel region 24 and is in contact therewith. A gate dielectric layer 37 (which is shown with stippling for clarity of illustration in FIG. 1) is on the superlattice 25, and a gate electrode layer 36 is on the gate dielectric layer and opposite the superlattice. Sidewall spacers 40, 41 are also provided in the illustrated MOSFET 20, as well as silicide layers 30, 31, and 34 on the lightly doped source and drain regions 22, 23 and the gate electrode layer 36, respectively.

The superlattice 25 advantageously acts as an interface for the gate dielectric layer 37 which provides reduced scattering and, thus, enhanced mobility with respect to prior art insulation layers such as silicon oxides used with high-K dielectrics. Moreover, use of the superlattice 25 as an insulator for applications using high-K dielectrics may result in smaller overall thicknesses, and thus improved device capacitance. This is because the superlattice 25 may be formed in relatively small thicknesses yet still provide desired insulating properties, as will be discussed further below.

The gate dielectric layer 37 preferably comprises a high-K dielectric having a dielectric constant of greater than about five and, more preferably, greater than about ten or twenty. By way of example, the gate dielectric layer may comprise one or more of $BaSrTiO_3$ (k=300), $Ta_2O_5$ (k=26), $ZrO_2$ (k=25), $HfO_2$ (k=24.5), $Al_2O_3$ (k=9), and $Si_3N_4$ (k=7), although other suitable high-K dielectric materials may also be used.

Applicants have identified improved materials or structures for the superlattice 25 of the MOSFET 20. More specifically, the Applicants have identified materials or structures having energy band structures for which the appropriate conductivity effective masses for electrons and/or holes are substantially less than the corresponding values for silicon.

Figure 2:
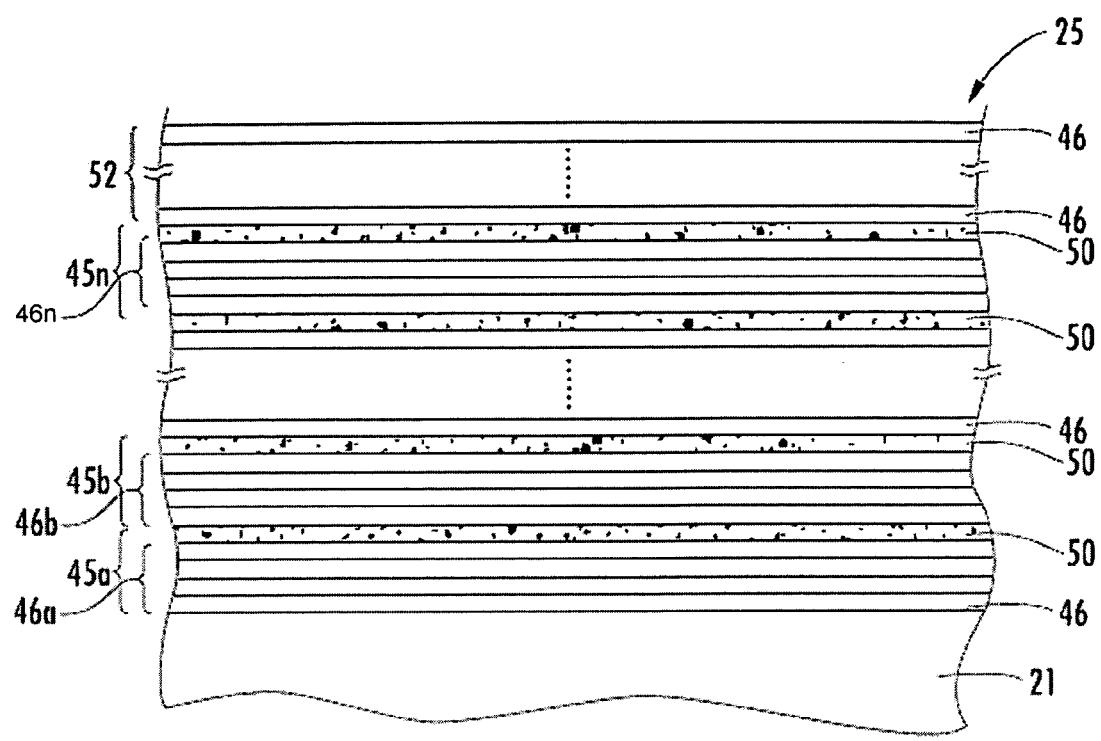
FIG. 2 is a greatly enlarged schematic cross-sectional view of the superlattice as shown in FIG. 1.
Figure 3:
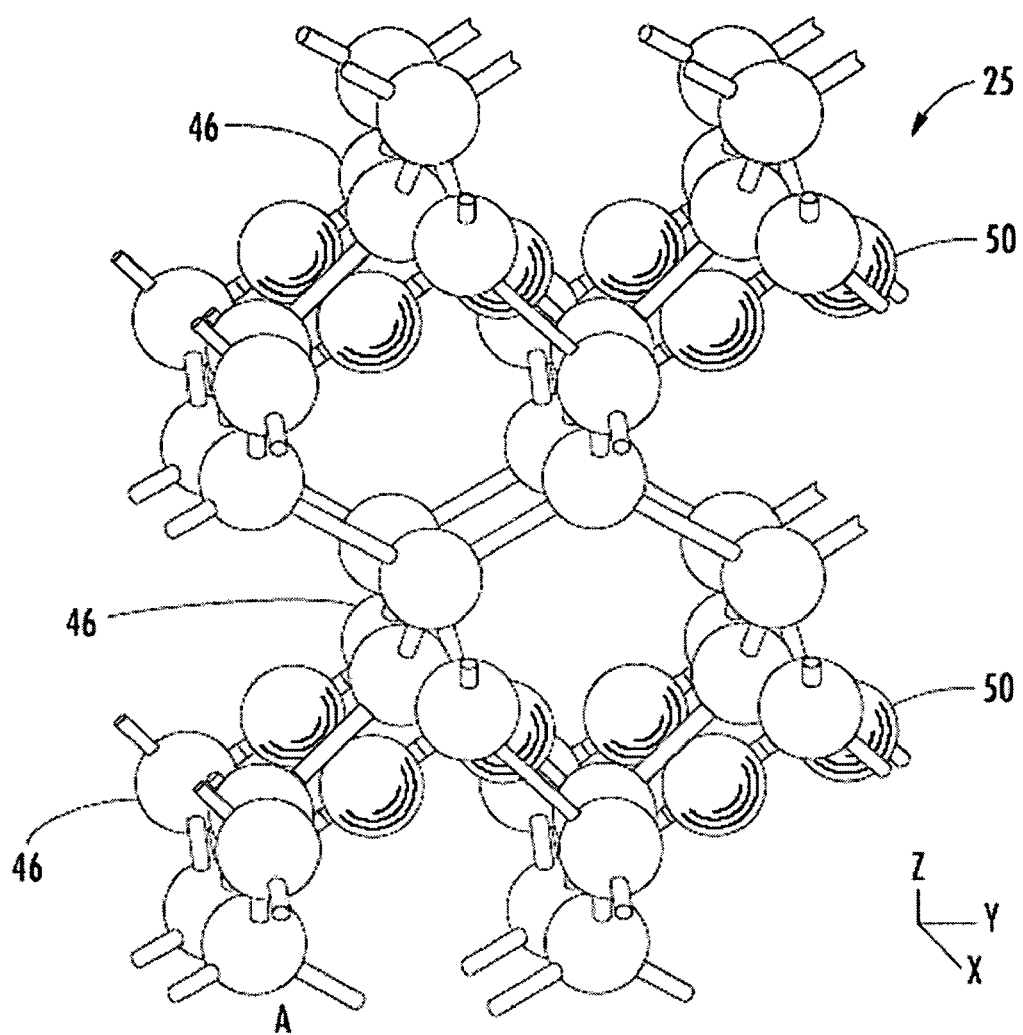
FIG. 3 is a perspective schematic atomic diagram of a portion of the superlattice shown in FIG. 1.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 2.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 2 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide the desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this structure may also advantageously act as a barrier to dopant and/or material bleed between layers vertically above and below the superlattice 25. These properties may thus advantageously allow the superlattice 25 to provide an interface for high-K dielectrics which not only reduces bleeding of the high-K material into the channel region, but which may also advantageously reduce unwanted scattering effects and improve device mobility, as will be appreciated by those skilled in the art.

It is also theorized that a semiconductor device, such as the illustrated MOSFET 20, will enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

Moreover, because of the above-described lower appropriate conductivity effective mass for the charge carriers in the parallel layer direction, in some embodiments the superlattice 25 may also advantageously be used to provide the channel region 24. That is, the illustrated superlattice 25 may be formed of a sufficient thickness so that lower groups of layers 45 may be used as the channel, while upper groups of layers may provide the high-K dielectric interface. Alternately, respective superlattice layers may be formed for these purposes. Further details on using such a superlattice as a channel in a semiconductor device are provided in U.S. application Ser. No. 10/647,069, which is assigned to the present Assignee and is hereby incorporated in its entirety by reference, for example.

In such embodiments where the channel 24 comprises a superlattice in accordance with the invention, the source/drain regions 22, 23 and gate 35 of the MOSFET 20 may be considered as regions for causing the transport of charge carriers through the superlattice in a parallel direction relative to the layers of the stacked groups 45a-45n. Other such regions are also contemplated by the present invention.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also. desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 2 and 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art. It may be especially appropriate to dope some portion of the superlattice 25 if the superlattice is to provide a portion of the channel, for example.

Figure 4:
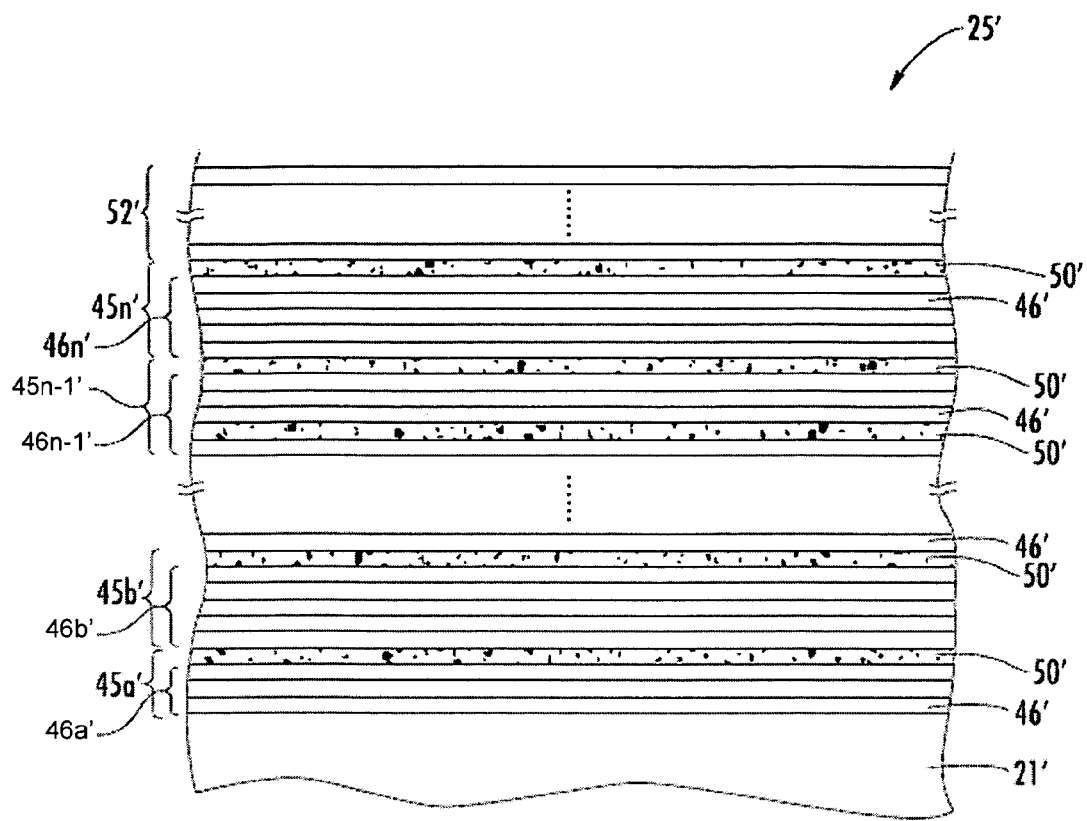
FIG. 4 is a greatly enlarged schematic cross-sectional view of another embodiment of a superlattice that may be used in the device of FIG. 1.

Referring now additionally to FIG. 4, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions 46a-46n of a superlattice 25 may be a same number of monolayers thick. In other embodiments, at least some of the base semiconductor portions 46a-46n may be a different number of monolayers thick. In still other embodiments, all of the base semiconductor portions 46a-46n may be a different number of monolayers thick.

Figure 5A:
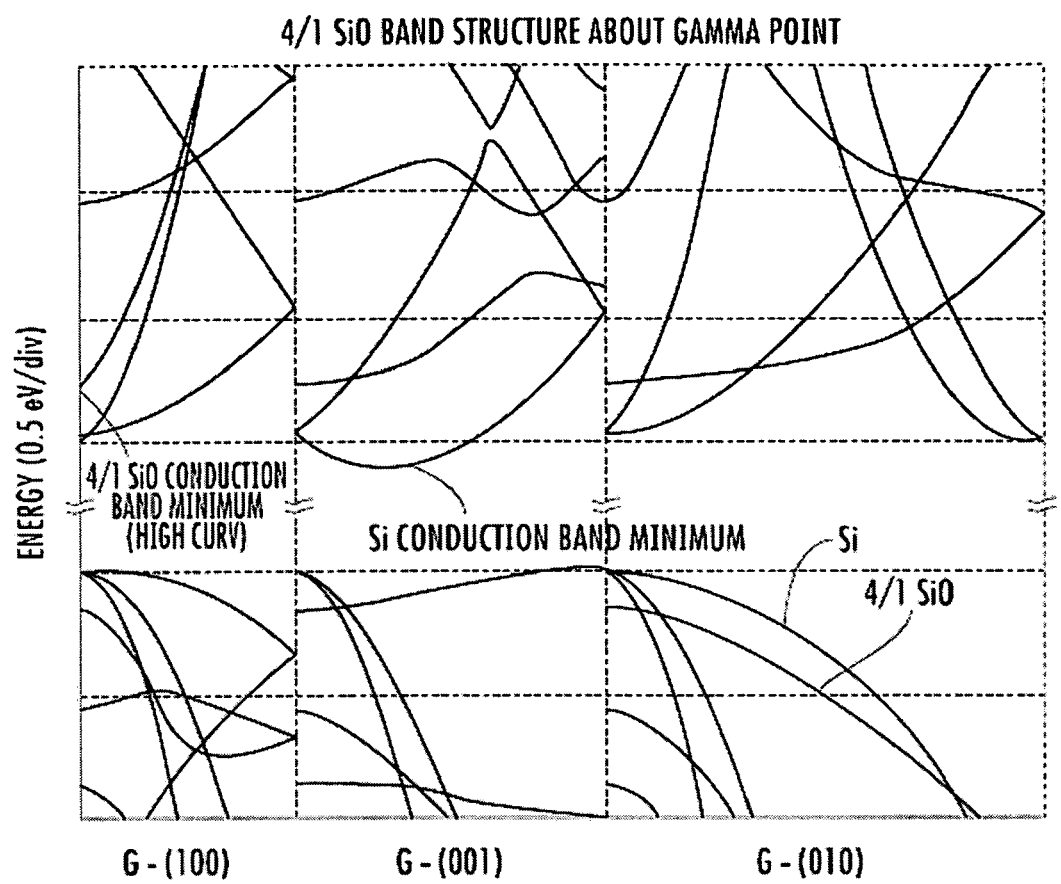
FIG. 5A is a graph of the calculated band structure from the gamma point (G) for both bulk silicon as in the prior art, and for the 4/1 Si/O superlattice as shown in FIGS. 1-3.
Figure 5B:
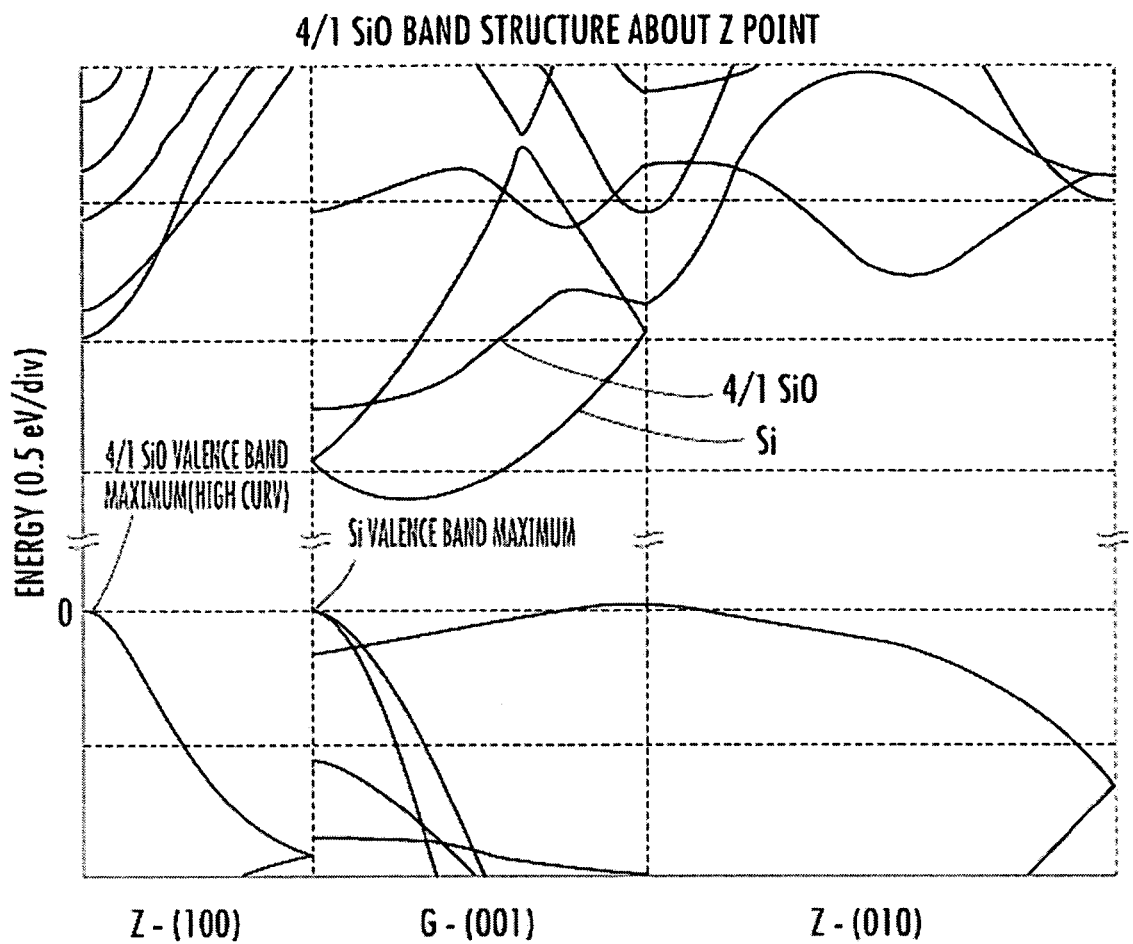
FIG. 5B is a graph of the calculated band structure from the Z point for both bulk silicon as in the prior art, and for the 4/1 Si/O superlattice as shown in FIGS. 1-3.
Figure 5C:
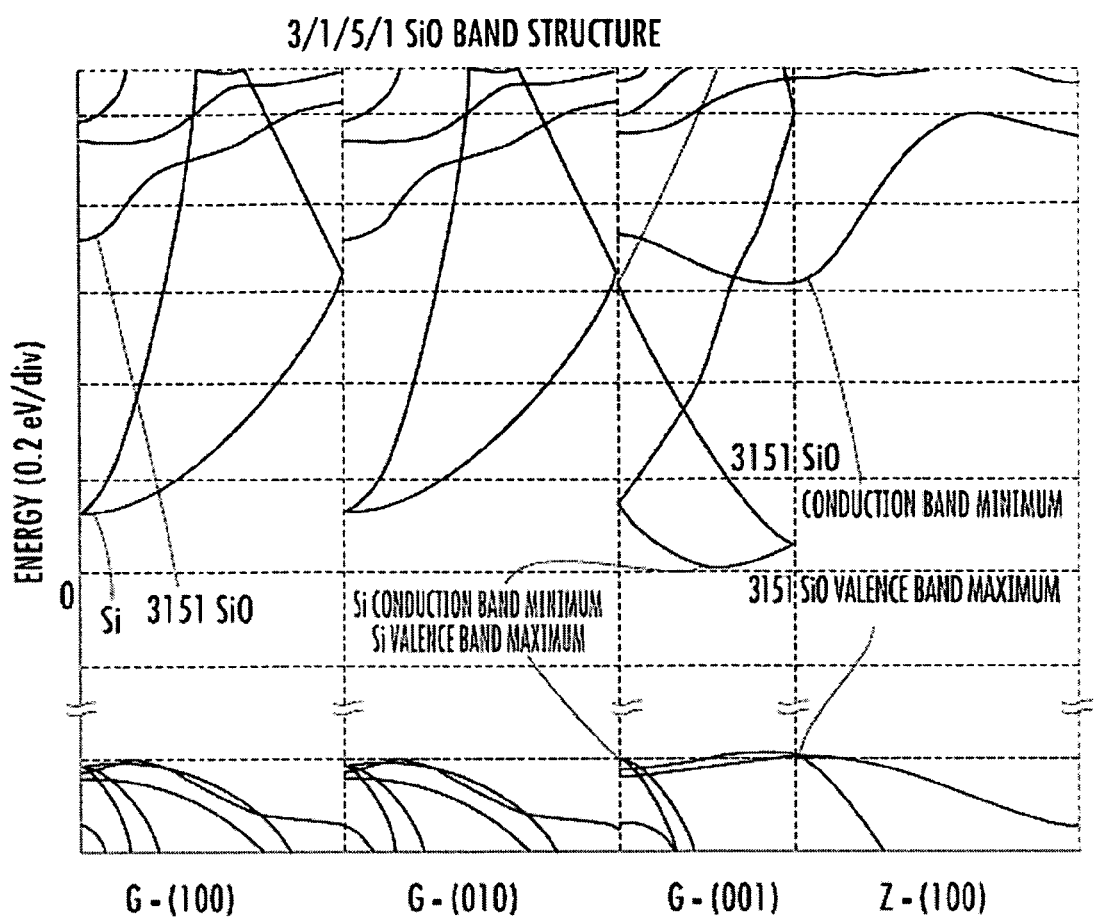
FIG. 5C is a graph of the calculated band structure from both the gamma and Z points for both bulk silicon as in the prior art, and for the 5/1/3/1 Si/O superlattice as shown in FIG. 4.

In FIGS. 5A-5C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIGS. 1-3 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 5B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 5C shows the calculated band structure from both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now additionally to FIGS. 6A-6E, a method for making the MOSFET 20 will now be described. The method begins with providing the silicon substrate 21. By way of example, the substrate may be an eight-inch wafer 21 of lightly doped P-type or N-type single crystal silicon with <100> orientation, although other suitable substrates may also be used. In accordance with the present example, a layer of the superlattice 25 material is then formed across the upper surface of the substrate 21.

More particularly, the superlattice 25 material is deposited across the surface of the substrate 21 using atomic layer deposition and the epitaxial silicon cap layer 52 is formed, as discussed previously above, and the surface is planarized. It should be noted that in some embodiments the superlattice 25 material may be selectively deposited in desired areas, rather than across the entire substrate 21, as will be appreciated by those skilled in the art. Moreover, planarization may not be required in all embodiments.

The epitaxial silicon cap layer 52 may have a preferred thickness to prevent superlattice consumption during gate oxide growth, or any other subsequent oxidations, while at the same time reducing or minimizing the thickness of the silicon cap layer to reduce any parallel path of conduction with the superlattice. According to the well-known relationship of consuming approximately 45% of the underlying silicon for a given oxide grown, the silicon cap layer may be greater than 45% of the grown gate oxide thickness plus a small incremental amount to account for manufacturing tolerances known to those skilled in the art. For the present example, and assuming growth of a 25 angstrom gate, one may use approximately 13-15 angstroms of silicon cap thickness.

Once formation of the superlattice 25 is completed, the gate dielectric layer 37 and the gate electrode layer 36 are formed. More particularly, the high-K material is deposited, and steps of poly deposition, patterning, and etching are performed to provide the gate stack illustrated in FIG. 6A. Poly deposition refers to low-pressure chemical vapor deposition (LPCVD) of silicon onto an oxide (hence it forms a polycrystalline material). The step includes doping with P+ or As— to make it conducting, and the layer may be around 250 nm thick, for example.

In addition, the pattern step may include performing a spinning photoresist, baking, exposure to light (i.e., a photolithography step), and developing the resist. Usually, the pattern is then transferred to another layer (oxide or nitride) which acts as an etch mask during the etch step. The etch step typically is a plasma etch (anisotropic, dry etch) that is material selective (e.g., etches silicon ten times faster than oxide) and transfers the lithography pattern into the material of interest.

The superlattice 25 material may be etched using known semiconductor processing techniques. However, it should be noted that with the non-semiconductor present in the superlattice 25, e.g., oxygen, the superlattice may be more easily etched using an etchant formulated for oxides rather than silicon. Of course, the appropriate etch for a given implementation will vary based upon the structure and materials used for the superlattice 25 and substrate 21, as will be appreciated by those of skill in the art.

Figure 6A:
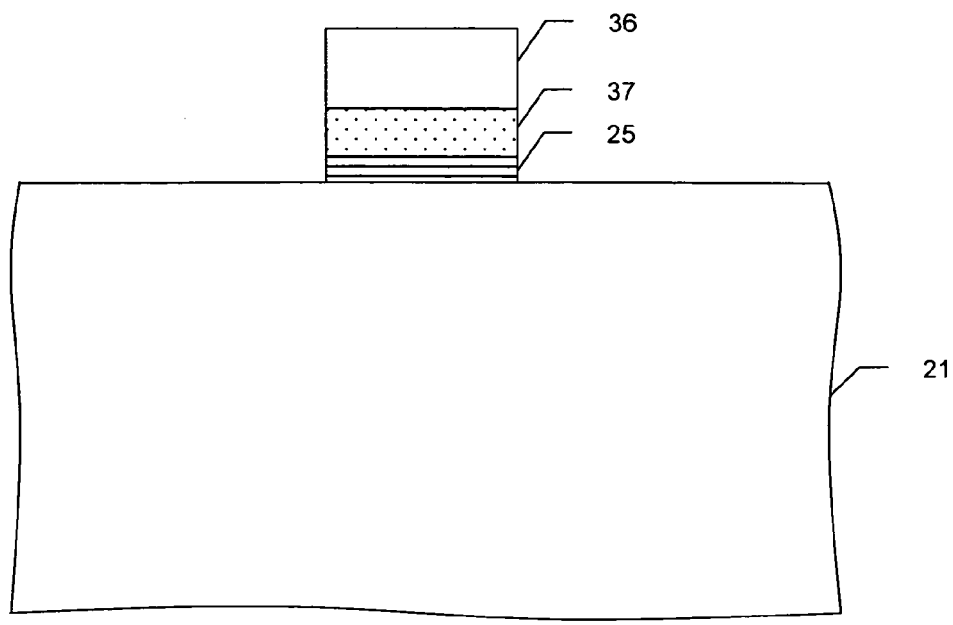
FIGS. 6A-6C are a series of schematic cross-sectional diagrams illustrating a method for making the semiconductor device of FIG. 1.
Figure 6B:
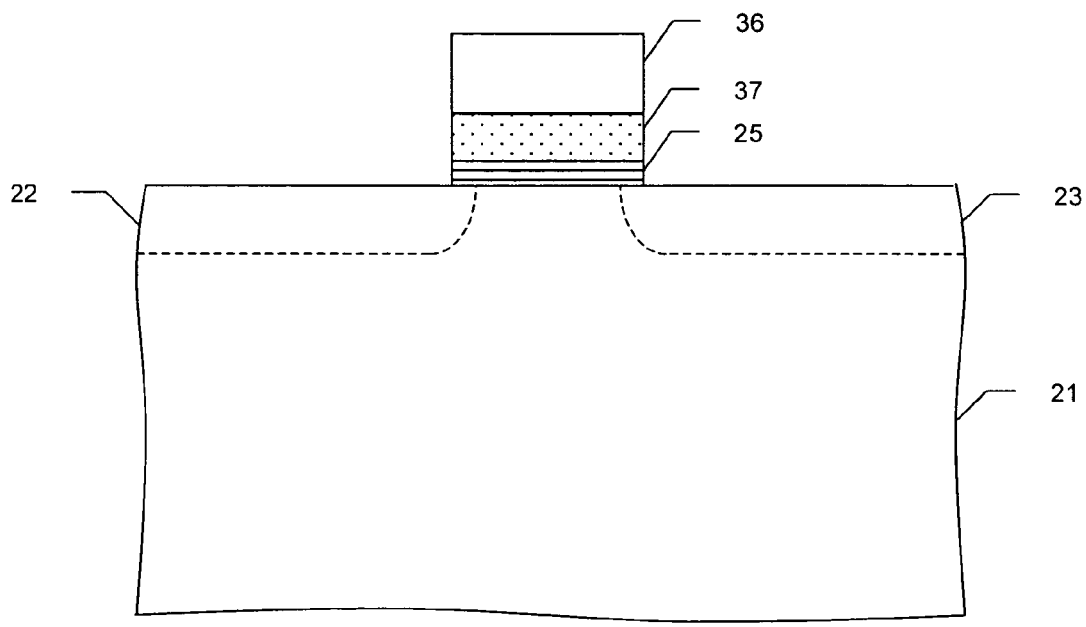

In FIG. 6B, the lightly doped source and drain ("LDD") extensions 22, 23 are formed. These regions are formed using n-type or p-type LDD implantation, annealing, and cleaning. An anneal step may be used after the LDD implantation, but depending on the specific process, it may be omitted. The clean step is a chemical etch to remove metals and organics prior to depositing an oxide layer.

Figure 6C:
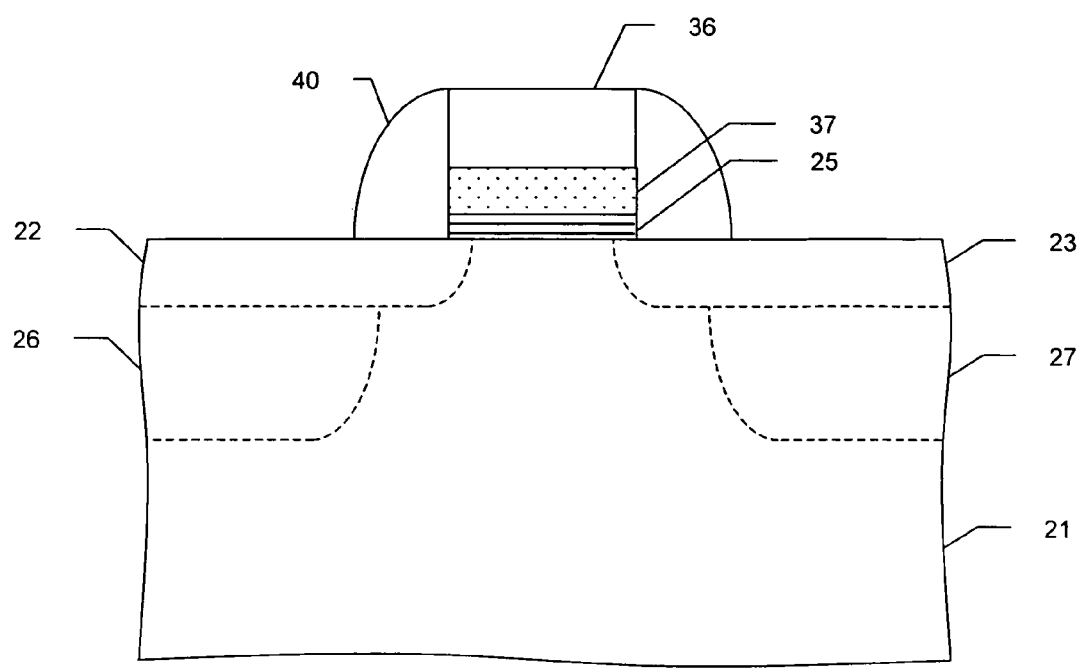

FIG. 6C shows the formation of the sidewall spacers 40, 41 and the source and drain 26, 27 implants. An $SiO_2$ mask may be deposited and etched back for this purpose. N-type or p-type ion implantation is used to form the source and drain regions 26, 27, depending upon the given implementation. The structure is then annealed and cleaned. Self-aligned silicide formation may then be performed to form the silicide layers 30, 31, and 34, and the source/drain contacts 32, 33, are formed to provide the final semiconductor device 20 illustrated in FIG. 1. The silicide formation is also known as salicidation. The salicidation process includes metal deposition (e.g., Ti), nitrogen annealing, metal etching, and a second annealing.

The foregoing is, of course, but one example of a process and device in which the present invention may be used, and those of skill in the art will understand its application and use in many other processes and devices. In other processes and devices the structures of the present invention may be formed on a portion of a wafer or across substantially all of a wafer. Additionally, the use of an atomic layer deposition tool may also not be needed for forming the superlattice 25 in some embodiments. For example, the monolayers may be formed using a CVD tool with process conditions compatible with control of monolayers, as will be appreciated by those skilled in the art. Further details regarding fabrication of semiconductor devices in accordance with the present invention may be found in the above-noted U.S. application Ser. No. 10/467,069, for example.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming a superlattice comprising a plurality of stacked groups of layers adjacent a semiconductor substrate;
   each group of layers of the superlattice comprising a plurality of stacked base semiconductor monolayers defining a base semiconductor portion and at least one non-semiconductor monolayer constrained within a crystal lattice of adjacent base semiconductor portions, and at least some semiconductor atoms from opposing base semiconductor portions being chemically bound together with the chemical bonds traversing the at least one non-semiconductor monolayer therebetween;
   forming a high-K dielectric layer adjacent the superlattice; and
   forming an electrode layer adjacent the high-K dielectric layer and opposite the superlattice.

2. The method of claim 1 wherein the high-K dielectric layer has a dielectric constant of greater than about five.

3. The method of claim 1 wherein the high-K dielectric layer has a dielectric constant of greater than about ten.

4. The method of claim 1 wherein the high-K dielectric layer has a dielectric constant of greater than about twenty.

5. The method of claim 1 wherein the at least one non-semiconductor monolayer constrained within the crystal lattice of adjacent base semiconductor portions is less than about five monolayers to thereby function as an energy band-modifying layer.

6. The method of claim 1 further comprising forming a channel region underlying the superlattice.

7. The method of claim 6 further comprising forming source and drain regions adjacent the channel region.

8. The method of claim 1 wherein the high-K dielectric layer comprises at least one of silicon oxide, zirconium oxide, and hafnium oxide.

9. The method of claim 1 wherein the base semiconductor comprises silicon.

10. The method of claim 1 wherein the at least one non-semiconductor monolayer comprises oxygen.

11. The method of claim 1 wherein the at least one non-semiconductor monolayer comprises a non-semiconductor selected from the group consisting essentially of oxygen, nitrogen, fluorine, and carbon-oxygen.

12. The method of claim 1 wherein the at least one non-semiconductor monolayer is a single monolayer thick.

13. The method of claim 1 wherein each base semiconductor portion is less than eight monolayers thick.

14. The method of claim 1 wherein all of the base semiconductor portions are a same number of monolayers thick.

15. The method of claim 1 wherein opposing base semiconductor monolayers in adjacent groups of layers of the superlattice are chemically bound together.

16. A method for making a semiconductor device comprising:
   forming a superlattice comprising a plurality of stacked groups of layers adjacent a semiconductor substrate;
   each group of layers of the superlattice comprising a plurality of stacked base silicon monolayers defining a base silicon portion and an energy band-modifying layer comprising at least one oxygen monolayer constrained within a crystal lattice of adjacent base silicon portions, and at least some silicon atoms from opposing base silicon portions being chemically bound together with the chemical bonds traversing the at least one oxygen monolayer therebetween;
   forming a high-K dielectric layer having a dielectric constant of greater than about five adjacent the superlattice; and
   forming an electrode layer adjacent the dielectric layer and opposite the superlattice.

17. The method of claim 16 wherein the high-K dielectric layer has a dielectric constant of greater than about twenty.

18. The method of claim 16 wherein the at least one non-semiconductor monolayer constrained within the crystal lattice of adjacent base semiconductor portions is less than about five monolayers to thereby function as an energy band-modifying layer.

19. The method of claim 16 further comprising forming a channel region underlying the superlattice.

20. The method of claim 19 further comprising forming source and drain regions adjacent the channel region.

21. The method of claim 16 wherein the high-K dielectric layer comprises at least one of silicon oxide, zirconium oxide, and hafnium oxide.

* * * * *

UNITED STATES PATENT AND TRADEMARK OFFICE
CERTIFICATE OF CORRECTION

PATENT NO. : 7,446,002 B2  Page 1 of 1
APPLICATION NO. : 11/136747
DATED : November 4, 2008
INVENTOR(S) : Robert J. Mears et al.

It is certified that error appears in the above-identified patent and that said Letters Patent is hereby corrected as shown below:

| | |
|---|---|
| Page 2, Line 31 | Delete: "6,521,549" <br> Insert: --6,521,519-- |
| Column 1, Line 13 | Delete: "abandoned" <br> Insert: --abandoned,-- |
| Column 2, Line 7 | Delete: "electromuminescence" <br> Insert: --electroluminescence-- |
| Column 5, Line 15 | Delete: "layers" <br> Insert: --layer-- |
| Column 6, Line 13 | Delete: "energy-band modifying" <br> Insert: --energy band-modifying-- |
| Column 7, Line 51 | Delete: "also." <br> Insert: --also-- |
| Column 10, Line 28 | Delete: "As— to" <br> Insert: --As- to-- |

Signed and Sealed this

Twenty-fourth Day of February, 2009

JOHN DOLL
*Acting Director of the United States Patent and Trademark Office*